(12) United States Patent
Rosenkranz et al.

(10) Patent No.: US 7,236,702 B2
(45) Date of Patent: Jun. 26, 2007

(54) METHOD AND SYSTEM FOR DUOBINARY CODING OF OPTICAL SIGNALS

(75) Inventors: Werner Rosenkranz, Laboe (DE); Christoph Wree, Kiel (DE)

(73) Assignee: Siemens Aktiengesellschaft, Munich (DE)

( * ) Notice: Subject to any disclaimer, the term of this patent is extended or adjusted under 35 U.S.C. 154(b) by 778 days.

(21) Appl. No.: 10/137,947

(22) Filed: May 3, 2002

(65) Prior Publication Data

US 2002/0181064 A1  Dec. 5, 2002

(30) Foreign Application Priority Data

May 4, 2001  (DE)  ................ 101 21 756

(51) Int. Cl.
*H04J 14/00* (2006.01)
(52) U.S. Cl. ............................ 398/77; 398/78; 398/190
(58) Field of Classification Search ................ 398/183, 398/201, 187, 188, 190, 77, 78; 359/184; 385/1; 358/146; 369/13
See application file for complete search history.

(56) References Cited

U.S. PATENT DOCUMENTS

| | | | | |
|---|---|---|---|---|
| 5,880,870 | A * | 3/1999 | Sieben et al. ............... | 398/183 |
| 6,067,180 | A * | 5/2000 | Roberts ....................... | 398/201 |
| 6,473,214 | B1 * | 10/2002 | Roberts et al. ............. | 398/183 |
| 6,865,348 | B2 * | 3/2005 | Miyamoto et al. .......... | 398/183 |

OTHER PUBLICATIONS

Optical Fiber Delay-Line Signal Processesing, Jackson et al. IEEE MTT-33, No. 3 March pp. 193-210 1985.*

Bohn et al. Upgrading of N×40 Gb/s WDM system from 100GHz to 50 GHz channel spacing by duobinary interleaving concept with transversal filter, European Conference on Optical Communication (ECOC'01), 30.09—Apr. 10, 2001, Amsterdam, Netherlands, vol. 4, pp. 532-533.*

Arne et al. Novel dispersion tolerant optical duobinary transmitter using phase modulator and bragg filter, ECOC'98, Sep. 20-24, 1998, Madrid , Spain.*

Journal of Lightwave Technology, vol. 16, No. 5, May 1998, pp. 788-797—"Characteristics of Optical Duobinary Signals in Terabit/s Capacity, High Spectral Efficiency WDM Systems" Takashi Ono et al.

IEEE Photonics Technology Letters May 6, 1994, No. 5, Extended 10 Gb/s Fiber Transmission Distance at 1538 nm Using a Duobinary Receiver, May et al., pp. 648-650.

(Continued)

*Primary Examiner*—Dzung Tran
(74) *Attorney, Agent, or Firm*—Bell, Boyd & Lloyd LLP

(57) ABSTRACT

A method and system for duobinary coding of optical signals, wherein a precoded duobinary signal is supplied to a phase modulator which converts it to a phase-modulated optical signal, an optical filter carries out the function of the coder and converts the phase-modulated signal to an optical duobinary signal, and the duobinary coding results in a reduction in the bandwidth. A wavelength division multiplex system is provided by precoding a number of binary signals and converting them to phase-modulated signals, which are in turn, combined via an optical multiplexer, wherein the multiplex signal formed in this way is supplied to an optical filter which operates simultaneously as a coder for all the signals and produces a group of duobinary signals, and a number of groups of duobinary signals can be interleaved in one another in order to produce a dense wavelength division multiplex signal.

8 Claims, 3 Drawing Sheets

OTHER PUBLICATIONS

XP-002185839—"Novel Dispersion Tolerant Optical Duobinary Transmitter Using Phase Modulator and Bragg Grating Filter", Royset et al., pp. 225-226.

Journal of Lightwave Technology Oct. 9, 2001, No. 10, "Coherent Optical Transversal Filter Using Silica-Based Waveguides for High Speed Signal Processing", Sasayama et al., pp. 1225-1230.

Proc. 27th Eur. Conf. on Opt. Comm, "Upgrading of N×40Gb/s WDM System from 100GHz to 50GHz Channel Spacing by Duobinary Interleaving Concept with Optical Transversal Filter", Wree et al., pp. 532-533.

Electronics Letters Jan. 18, 2001, vol. 37, No. 2, pp. 109-110 "320 Gbit/s WDM repeaterless transmission using fully encoded 40 Gbit/s optical duobinary channels with dispersion tolerance of 380 ps/nm", Yonenaga et al.

* cited by examiner

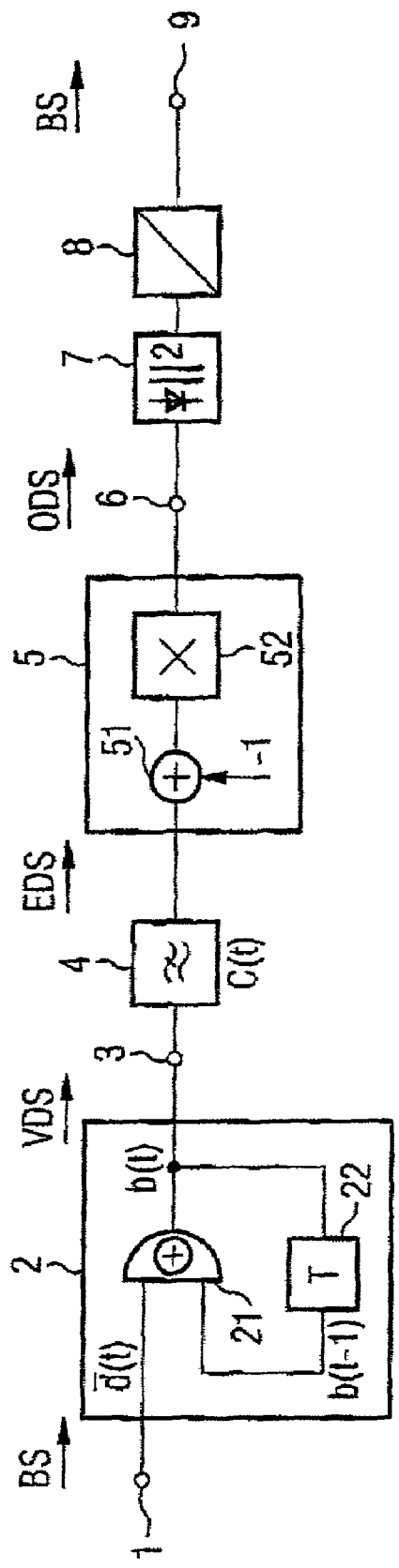
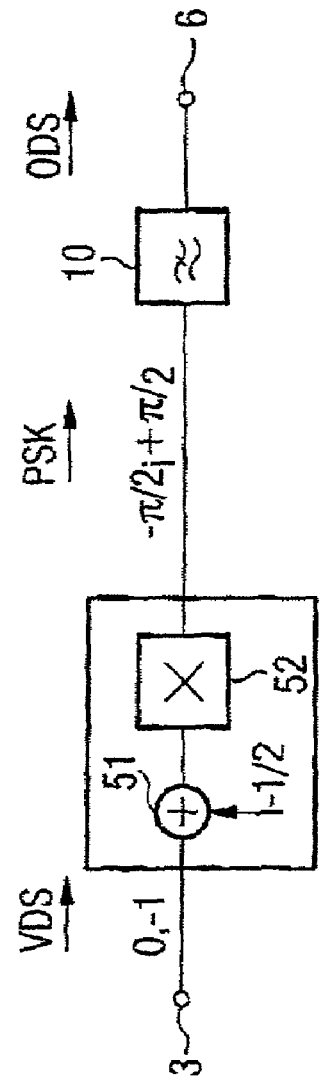

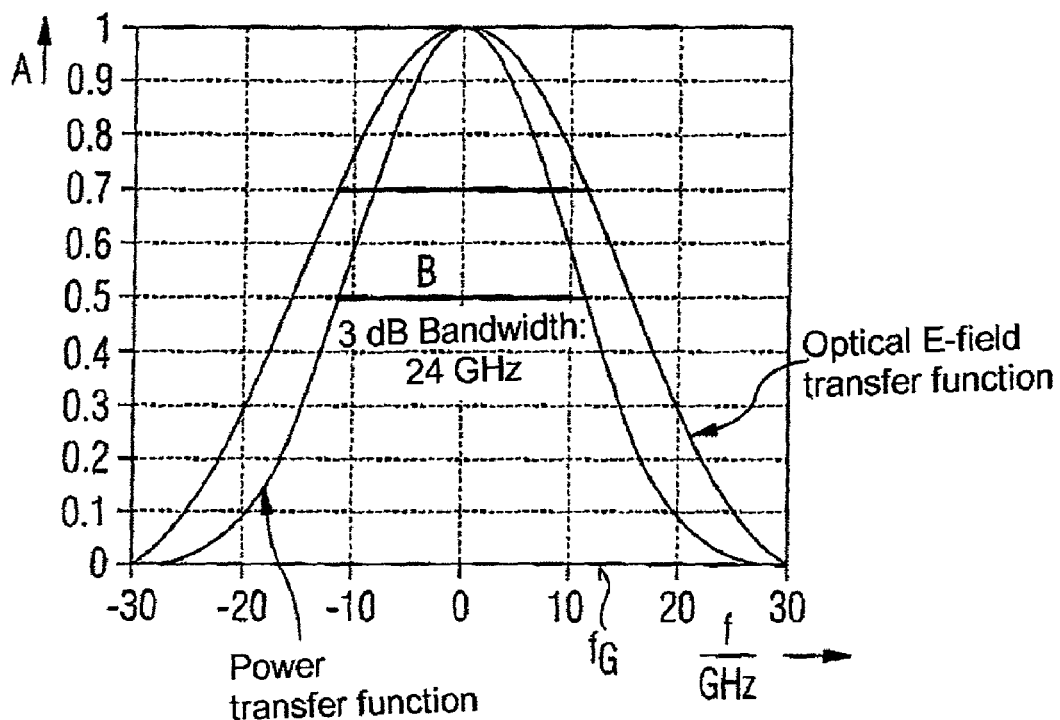
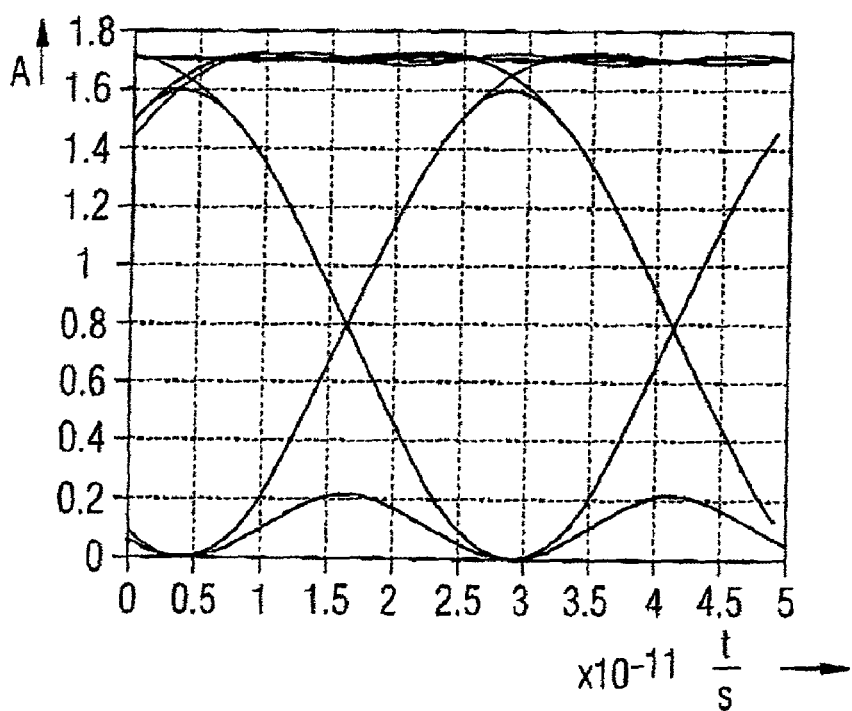

METHOD AND SYSTEM FOR DUOBINARY CODING OF OPTICAL SIGNALS

BACKGROUND OF THE INVENTION

Duobinary coding is advantageously used in transmission systems in order to reduce the transmission bandwidth or to increase the transmission capacity. In the case of duobinary coding, a special case of partial response binary coding, a binary data signal is converted to a three-stage signal using a specific coding rule. The bandwidth requirement for this ternary transmission signal is, in consequence, halved in comparison to that of a binary data signal. The code, which was originally developed for transmission of electrical signals, is also used for the transmission of optical signals, owing to these characteristics.

The use of this code is also explained for optical signal transmission in the journal "Journal of Lightwave Technology", Vol. 16, No. 5, May 1998, pages 788 to 797, "Characteristics of Optical Duobinary Signals in Terabit/s Capacity, High-Spectral Efficiency WDM Systems", Takashi Ono et al. The duobinary signals are converted to an amplitude-modulated and phase-modulated optical transmission signal. Two duobinary (ternary) values are transmitted via one high signal level and two different phase angles, with the carrier signal being at zero level, or at only a low level, for a third value. In principle, it is also possible to transmit other states but these are generally less advantageous for optical systems. The duobinary coding can be carried out via a precoder and at least one electrical filter, after which conversion to an optical signal is carried out via an optical modulator; for example, a Mach-Zehnder modulator.

An arrangement for duobinary coding using a precoder and two electrical low-pass filters, via which an optical modulator is driven, is described in Electronics Letters Jan. 18, 2001, Vol. 37, No. 2, pages 109 to 110 "320 Gbit/s WDM repeaterless transmission using fully encoded 40 Gbit/s optical duobinary channels with dispersion tolerance of 380 ps/nm" by K. Yonenaga et al. However, it is difficult to drive the modulator satisfactorily in both directions via two identical signals at a high transmission rate of approximately 40 Gbit/s. Furthermore, electrical coding of the signal results in the optical signal downstream from the nonlinear Mach-Zehnder modulator being spectrally broadened, thus reducing the bandwidth efficiency. The electrical low-pass filters are required for each modulator.

An object of the present invention, therefore, is to specify a method and a system for duobinary coding with improved signal quality. A method and a system for wavelength division multiplex systems (WDM systems), which can be implemented with little effort, is desired as well.

SUMMARY OF THE INVENTION

The advantage of the present invention is primarily the avoidance of the spectral broadening and deterioration of the signal-to-noise ratio that occur in conventional coding arrangements.

One major advantage of coding using optical low-pass filters is, however, that a number of signals (channels) at the same data rate also can be coded simultaneously using only one optical transversal filter. This is feasible owing to the strict periodicity of the optical filters in the frequency domain. If this is chosen so that it corresponds to the channel separation in a WDM system, then considerable complexity can be saved by simultaneous duobinary coding of the signals.

Owing to the narrow bandwidth required, this coding is particularly advantageous when designing DWDM systems (Dense) with a small channel separation. The total number of channels is subdivided into two or more groups, whose mid-frequencies are each shifted through half the channel separation of one group (if there are two groups) with respect to one another. The signals in the two channel groups are first of all combined in each case to form a WDM signal and are then duobinary coded, which leads to channels with a narrow bandwidth. These channel groups are combined once again via a coupler to form a DWDM signal.

Additional features and advantages of the present invention are described in, and will be apparent from, the following Detailed Description of the Invention and the Figures.

BRIEF DESCRIPTION OF THE FIGURES

FIG. 1 shows a known arrangement for duobinary coding.

FIG. 2 shows an arrangement according to the present invention for duobinary coding.

FIG. 5 shows the transfer function of an optical transversal filter.

FIG. 6 shows an eye diagram for this filter.

DETAILED DESCRIPTION OF THE INVENTION

Figure 3:
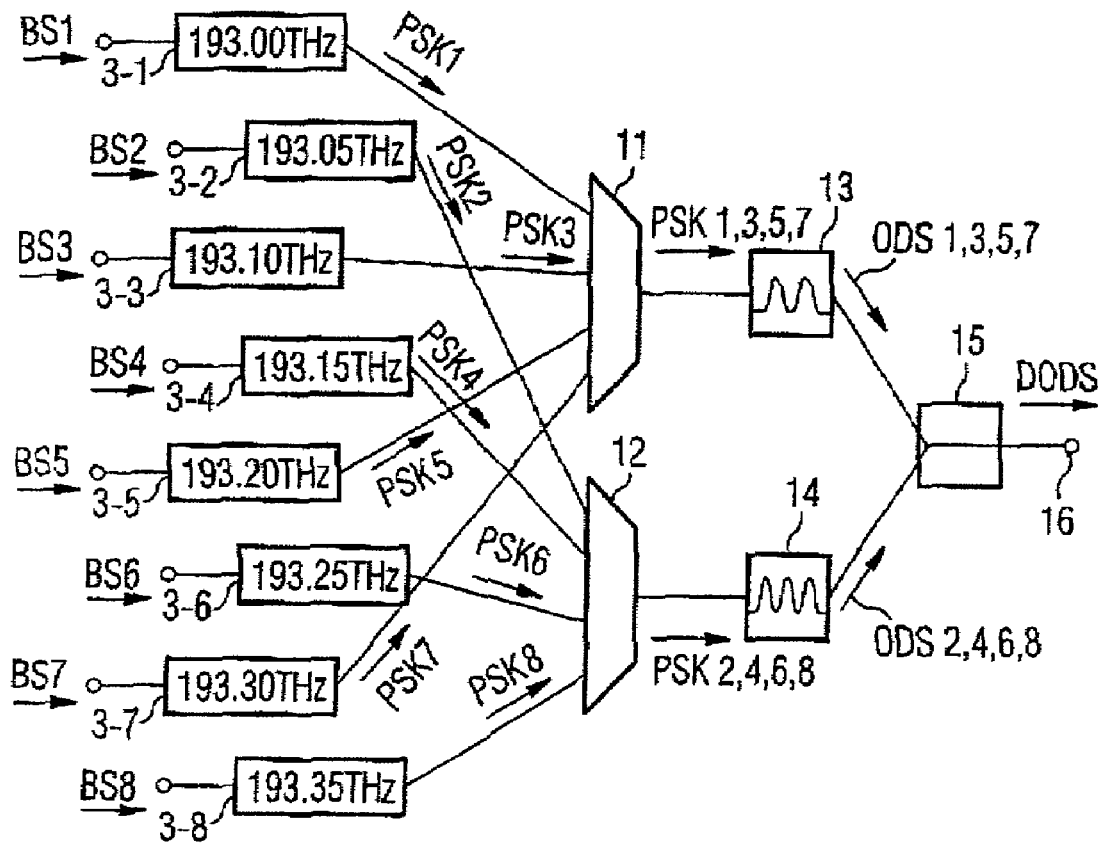
FIG. 3 shows an arrangement for producing a wavelength division multiplex signal.

FIG. 1 shows a known arrangement for duobinary coding of an optical signal. This includes a series circuit formed by a precoder 2, whose data input 1 is supplied with a (possibly inverted) binary signal BS, an electrical filter 4 and a phase modulator 5, at whose output 4 an optical duobinary signal ODS is emitted. A Mach-Zehnder modulator 52 with a drive circuit 51 is used as the modulator 5. Elements which are not significant to the present invention are not illustrated.

The precoder 2, in this case in the form of an exclusive-OR gate 21 and a delay element 22 (which, if required, also contains an inverter), sconverts the binary signal BS, which has the states 0 and 1, to a precoded duobinary signal VDS in accordance with the function $b(t)=\overline{d}(t)\oplus b(t-1)$. The filter 4 which is used as a coder, uses this to produce a duobinary signal EDS with the states 0, 1 and 2, by superimposition of the binary states. The drive circuit 51 converts these states to suitable drive signals with the states −1, 0, 1, which causes the Mach-Zehnder modulator 32 to emit two signal values −1 and +1, which have a high level and phases which differ by 180°, and a third signal value, in which the level is as far as possible suppressed. A receiver 7 assesses only the signal levels, which are once again converted by a downstream decoder 8 to the binary signal BS which is emitted at the data output 9.

The transmitting section of the known arrangement is now replaced by a system according to the present invention as illustrated in FIG. 2. In this arrangement, the precoded duobinary signal VDS is supplied directly to the optical modulator 5. This once again contains the drive circuit 51 and the Mach-Zehnder modulator 52. The drive circuit causes the Mach-Zehnder modulator 52 to emit a phase-modulated signal PSK, whose two states have phases (−π/2, +π/2, or more practically 0 and π, etc.) which are shifted through 180° with respect to one another and are symbolically referred to as $-\frac{\pi}{2}$ and $+\frac{\pi}{2}$.

The phase-modulated signal PSK is now converted to a duobinary signal by the optical filter 10, which carries out the function c(t)=c(t−1)+c(t) of a conventional coder for duobinary signals. The duobinary coding is carried out in the filter by superimposing the current signal value, corresponding to the filter function, on a signal value (bit) of a precoded binary signal stored in accordance with the filter function, in which case states with the same phase angle are added and states with opposite phase angles lead to cancelation of the signal.

Careful dimensioning of the filter is, thus, critical to the quality of the duobinary signal. Transversal filters which have a finite impulse response and whose ideal duration (of an ideal filter) is (approximately) two bits and which have a stabilization time of (approximately) two bits are particularly suitable for this purpose. Appropriate filter structures can be produced on the basis of planar optical waveguides. These are described, for example, by Koji Sasayama et al. "Coherent optical transversal filter using silica-based waveguides for high-speed signal processing" in IEEE Journal of Lightwave Technology, Vol. 9, No. 10, October 1991. Fiber-optic delay structures which are based on incoherent superimposition of the light likewise also can be used. These are described by K. Jackson et al. in "Optical Fiber Delay-Line Signal Processing Transactions on Microwave Theory and Techniques, Vol. MTT-33. No. 3, pp. 193–210, March 1985. The filters that are used will be described in even more detail later on.

The major advantage of duobinary coding using optical filters over the conventional coding process with a computation circuit is, as already mentioned, that duobinary coding can be carried out simultaneously for a number of WDM channels using only a single optical filter. This is because of the strict periodicity of the optical filters in the frequency domain. If this is chosen such that it corresponds to the channel separation in a WDM system, then simultaneous duobinary coding can be carried out, in particular, in a system with a large number of channels, wherein a considerable amount of complexity is saved.

FIG. 3 shows a DWDM system. Four precoder modulator devices 3-1, 3-3, 3-5, 3-7, to which a respective binary signal BS1, BS3, BS5, BS7 is supplied, produce a respective phase-modulated signal PSK1, PSK3, PSK5, PSK7. These signals are combined in a first optical multiplexer 11 to form a group, a first multiplex PSK signal PSK1,3,5,7. The output of this optical multiplexer is connected to a first optical filter 13, which carries out duobinary coding simultaneously for all the signals PSK1, PSK3, PSK5, PSK7 in the group, and emits a group ODS1,3,5,7 of duobinary-coded signals; that is to say, a multiplex duobinary signal. In a corresponding way, further binary signals BS2, BS4, BS6, BS8 are converted in further precoder modulation devices 3-2, 3-4, 3-6, 3-8, to phase-modulated signals PSK2, PSK4, PSK6, PSK8 which are combined by a second optical multiplexer 12 and are converted by a second optical filter to a second group ODS2,4,6,8 of binary signals; that is to say, a second multiplex duobinary signal. The duobinary coding halves the bandwidth of the individual signals in each duobinary multiplex signal, so that they can be combined without any problems via a coupler 15 to form a duobinary-coded dense multiplex signal DODS, which is emitted at the transmission output 16.

Figure 4:
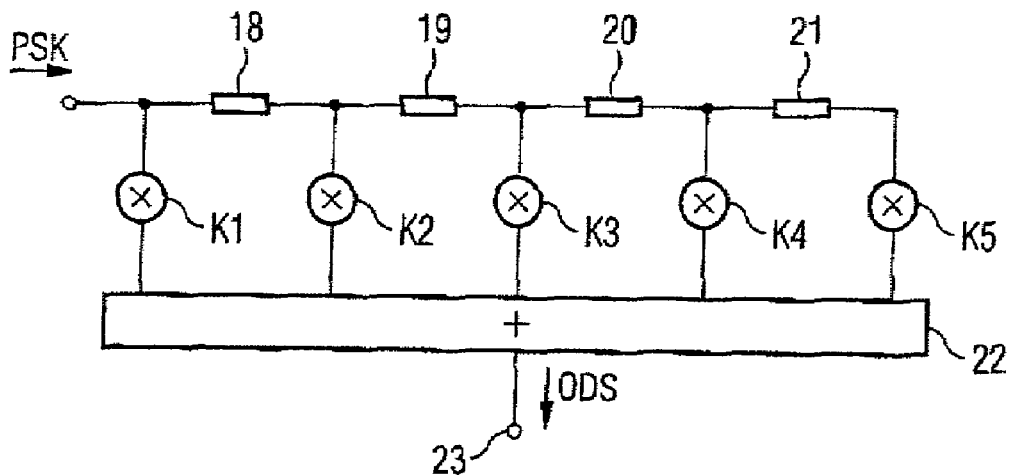
FIG. 4 shows an optical transversal filter.

FIG. 4 shows the outline circuit diagram of a suitable optical transversal filter. For a transmission system at 40 Gbit/s the delay times of the delay elements 18 to 21 are each 10 picoseconds and the five coefficients of the filter 13 are 0.33; 0.79; 1; 0.79; 0.33; thus, intrinsically modeling an ideal filter function sufficiently accurately. The idealized impulse response, which is obtained by interpolation, has a duration of 50 picoseconds. The coefficients K1-K5 already include the attenuation of the individual couplers. The coefficients of the second optical filter are 0.33; −0.79; 1; −0.79; 0.33. The negative coefficients are produced by shifting the phase of the optical signal by adjusting the delay elements. As in the case of a conventional transversal filter, the signals weighted by the coefficients are combined in a coupler-adder 22 and are emitted at the filter output 23, with the signals multiplied by a negative coefficient being in antiphase and, thus, being subtracted.

The filter 14 has a transfer function (magnitude of the frequency response) which is illustrated in FIG. 5, the output amplitude A as a function of the frequency f in Hz (1/s). The influence of the other circuit components is also taken into account when designing the filter. If an electrical low-pass filter were to be used for coding in a 40 Gbit/s system, the cut-off frequency $f_G$ (3 dB frequency) would be chosen to be a quarter of the bit rate, that is to say in this case 10 GHz, since the downstream Mach-Zehnder modulator broadens the spectrum once again. If an optical filter is used, a somewhat higher cut-off frequency of about 12 GHz (10.5 to 13.5 GHz) and a bandwidth B=24 GHz are chosen. A transfer function with a cosine profile is desirable since this results in a good transient response. The first zero in this case occurs at 30 GHz.

FIG. 6 shows an eye diagram recorded without a receiving filter, the amplitude A as a function of the time t in seconds for a short transmission path.

Previous WDM systems also can be upgraded via this method into DWDM systems.

Although the present invention has been described with reference to specific embodiments, those of skill in the art will recognize that changes may be made thereto without departing from the spirit and scope of the present invention as set forth in the hereafter appended claims.

The invention claimed is:

1. A method for duobinary coding a group of binary optical signals with same frequency separations, the method comprising the steps of:

converting the binary signals in a precoder to precoded duobinary signals;

converting the precoded duobinary signals to phase-modulated optical signals with two signal values which are phase-shifted through π with respect to one another;

combining the phase-modulated optical signals to a group of phase-modulated optical signals; and supplying the group of phase-modulated optical signal to an a periodic optical filter, which cut-off frequency and delay time are matched to a data rate of the precoded duobinary signals, and which, acting as a coder, simultaneously converts the phase-modulated optical signals to a group of duobinary signals produced by superimposition of directly successive signal values of each phase-modulated optical signal.

2. A method for duobinary coding a group of binary optical signals as claimed in claim 1, wherein m groups of binary signals are converted to m groups of phase-modulated signals with the phase-modulated signals in one group having the same frequency separations, but being offset by 1/m of a multiple of their frequency separation, with respect to the phase-modulated signals in other groups, and the m groups of phase-modulated signals are converted to m groups of duobinary signals, and the m groups of duobinary signals are combined to form a dense multiplex duobinary signal.

3. A method for duobinary coding a group of binary optical signals as claimed in claim 2, wherein two groups of duobinary signals are combined to form a dense multiplex duobinary signal.

4. A method for duobinary coding a group of binary optical signals as claimed in claim 1, wherein the conversion of a group of phase-modulated signals to a group of duobinary signals is carried out via a filter whose transfer function has a cosine profile and whose idealized impulse response occurs at twice a bit length of the binary signal.

5. A system for duobinary coding a group of binary optical signals, comprising:
   a wavelength division multiplexer;
   a plurality of precoder-modulator devices, wherein each device has a precoder and phase modulator and to whose inputs binary signals are supplied, and whose outputs are connected to the wavelength division multiplexer; and
   an optical filter connected to an output of the wavelength division multiplexer as a coder for producing optical duobinary signals.

6. A system for duobinary coding a group of binary optical signals as claimed in claim 5, wherein the wavelength division multiplexers comprise m wavelength division multiplexers, each of which emits a group of phase-modulated optical signals at respective outputs, with mid-frequencies of the wavelength division multiplexers being offset with respect to one another, an optical filter for producing a group of optical duobinary signals is connected to the output of each multiplexer, and the outputs of the filters are passed to one of a coupler and a filter in order to combine the m groups of optical duobinary signals.

7. A system for duobinary coding a group of binary optical signals as claimed in claim 5, wherein the optical filter is a transversal filter.

8. A system for duobinary coding a group of binary optical signals as claimed in claim 5, wherein a transfer function of the optical filter has a cosine profile, and a duration of an idealized impulse response occurs at twice a bit length of the binary signal.

* * * * *